United States Patent
Uchida

(10) Patent No.: US 8,778,146 B2
(45) Date of Patent: Jul. 15, 2014

(54) METHOD FOR MANUFACTURING PERPENDICULAR MAGNETIC RECORDING MEDIUM

(75) Inventor: Shinji Uchida, Tochigi (JP)

(73) Assignee: Fuji Electric Co., Ltd. (JP)

( * ) Notice: Subject to any disclaimer, the term of this patent is extended or adjusted under 35 U.S.C. 154(b) by 119 days.

(21) Appl. No.: 13/279,817

(22) Filed: Oct. 24, 2011

(65) Prior Publication Data

US 2012/0100396 A1 Apr. 26, 2012

(30) Foreign Application Priority Data

Oct. 25, 2010 (JP) .................................. 2010-238550

(51) Int. Cl.
*C23C 14/34* (2006.01)

(52) U.S. Cl.
USPC ................................ 204/192.2; 204/192.22

(58) Field of Classification Search
USPC .......................................... 204/192.2, 192.22
See application file for complete search history.

(56) References Cited

U.S. PATENT DOCUMENTS

| 5,652,054 | A | 7/1997 | Kikitsu et al. |
| 6,068,739 | A | 5/2000 | Suzuki et al. |
| 6,641,934 | B1 * | 11/2003 | Suzuki et al. ............. 428/828 |
| 6,676,814 | B1 * | 1/2004 | Stollenwerk et al. .... 204/192.22 |
| 2001/0036564 | A1 | 11/2001 | Ohmori |
| 2004/0161638 | A1 | 8/2004 | Maeda et al. |
| 2008/0080093 | A1 * | 4/2008 | Inamura et al. .......... 360/125.73 |
| 2009/0067232 | A1 * | 3/2009 | Korenivski ................... 365/171 |

FOREIGN PATENT DOCUMENTS

| JP | 05-189824 A | 7/1993 |
| JP | 08-083418 A | 3/1996 |
| JP | 08-130114 A | 5/1996 |
| JP | 3010156 B2 | 12/1999 |
| JP | 2001-073126 A | 3/2001 |
| JP | 2001-101645 A | 4/2001 |
| JP | 2001-189010 A | 7/2001 |
| JP | 2001-291230 A1 | 10/2001 |
| JP | 33182047 B2 | 6/2002 |
| JP | 2002-348663 A | 12/2002 |
| JP | 2004-178753 A | 6/2004 |
| JP | 2010-503139 A | 1/2010 |
| WO | 02/39433 A1 | 5/2005 |

OTHER PUBLICATIONS

Japanese Office Action issued in counterpart Japanese application No. JP2010-238550, issued Sep. 25, 2012. Partial English translation provided.

* cited by examiner

*Primary Examiner* — Rodney McDonald
(74) *Attorney, Agent, or Firm* — Rossi, Kimms & McDowell LLP

(57) ABSTRACT

A method for manufacturing with high productivity a magnetic recording medium having an MgO film is disclosed which uses a DC sputtering method. The method suppresses oxygen deficiency in the MgO film, and the MgO film has high crystallinity. The method includes at least a process of forming an intermediate layer of MgO on a nonmagnetic base by a reactive DC sputtering method that uses a target containing Mg and MgO in an oxygen-containing gas, and a process of forming a magnetic recording layer containing an $L1_0$ ordered alloy on the intermediate layer.

14 Claims, 1 Drawing Sheet

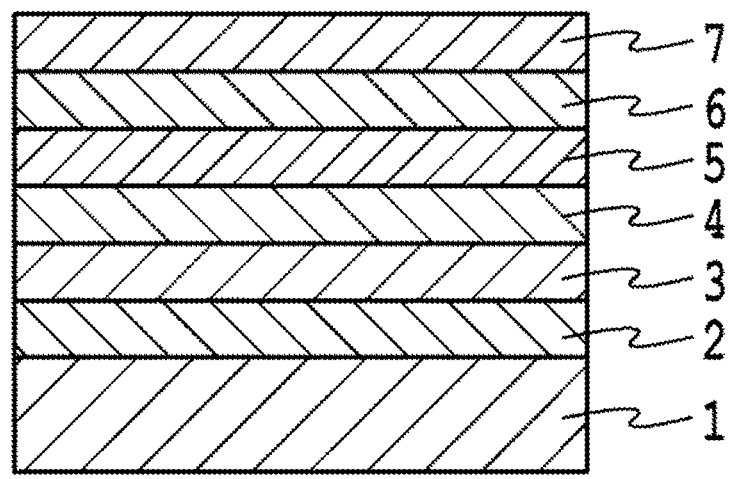

METHOD FOR MANUFACTURING PERPENDICULAR MAGNETIC RECORDING MEDIUM

BACKGROUND OF THE INVENTION

A. Field of the Invention

This invention relates to a method for manufacturing a perpendicular magnetic recording medium mounted in various magnetic recording devices.

B. Description of the Related Art

Perpendicular magnetic recording methods are being adopted as technology to realize high densities in magnetic recording. A perpendicular magnetic recording medium has a configuration which includes at least a magnetic recording layer formed from hard magnetic material, and which further optionally includes a under layer formed from a soft magnetic material which serves to concentrate magnetic flux generated by the magnetic head in the magnetic recording layer, an under layer to orient the magnetic recording layer in an intended direction, a protective film which protects the surface of the magnetic recording layer, and similar.

As materials used to form the magnetic recording layer of a perpendicular magnetic recording medium, CoCrPt, CoCrTa, and other alloy materials with $SiO_2$, $TiO_2$ or other nonmagnetic materials added to form a granular magnetic film have been proposed (see Japanese Patent Application Laid-open No. 2001-291230, Japanese Patent Application Laid-open No. H08-083418, and WO 02/039433). For example, in a CoCrPt—$SiO_2$ granular magnetic film, nonmagnetic $SiO_2$ is segregated so as to surround the periphery of CoCrPt magnetic crystal grains, and by means of this nonmagnetic $SiO_2$, individual CoCrPt magnetic crystal grains are magnetically separated.

In recent years there has been a pressing need to reduce the grain diameters of magnetic crystal grains in granular magnetic films and further raise the recording densities of perpendicular magnetic recording media. On the other hand, reduction of the grain sizes of magnetic crystal grains lowers the thermal stability of recorded magnetization. Consequently in order to compensate for the lowered thermal stability due to reduced grain sizes of magnetic crystal grains, formation of the magnetic crystal grains in granular magnetic films using materials with higher magnetocrystalline anisotropy has been sought.

Among materials having the desired high magnetocrystalline anisotropy, there are $L1_0$ ordered alloys, and various methods have been proposed for manufacturing thin films of $L1_0$ ordered alloys (see Patent Publication No. 3318204, Patent Publication No. 3010156, Japanese Patent Application Laid-open No. 2001-101645, Japanese Patent Application Laid-open No. 2004-178753, and Japanese Translation of PCT Application No. 2010-503139). On the other hand, in magnetic recording media, nonmagnetic bases of aluminum or glass have been used in consideration of strength, shock resistance and other properties. When depositing an $L1_0$ ordered alloy onto such a nonmagnetic base, the under layer is important. This is because in order to impart high magnetocrystalline anisotropy, the crystals of the $L1_0$ ordered alloy must have an (001) orientation (the crystal [001] axis must be perpendicular to the plane of the base). To this end, generally MgO, which has an appropriate lattice mismatch (good lattice matching) with $L1_0$ ordered alloys, is used as the under layer.

Further, with the goal of improving the adhesion property with a magnetic recording layer comprising an $L1_0$ ordered alloy and an under layer, it has been proposed that in place of MgO, an under layer can be used comprising {100} orientation NaCl-type crystal, {100} orientation CsCl-type crystal, intermetallic compound having a {001} orientation $L1_0$ type structure, or intermetallic compound having a {001} orientation $L1_2$ type structure, and having a lattice constant of from 3.52 Å to 4.20 Å (see Japanese Patent Application Laid-open No. 2001-189010). In this document, the MgO under layer is formed using an RF sputtering method. There is no description of the target to be used.

One problem when forming an MgO film is low productivity. That is, because MgO has low electrical conductivity, when forming an MgO film by a sputtering method using an MgO target, it has been necessary to use an RF sputtering method. However, the rate of film deposition of RF sputtering methods is lower than the film deposition rate for DC sputtering methods normally used in the manufacture of magnetic recording media. Due to the low film deposition rate, RF sputtering methods are not well-suited to mass production of magnetic recording media, for which productivity of from 400 to 1000 units per hour are required for each film production line. In addition to improving productivity of magnetic recording media, from the standpoints of cost reduction and stability of manufacturing equipment, it is desirable that a DC sputtering method be used for MgO film.

Further, when an MgO under layer is formed by a sputtering method in an atmosphere not containing oxygen, oxygen deficiency occurs in the crystal structure of the MgO film formed, and the MgO crystallinity is harmed. Hence an MgO film formation method which can suppress oxygen deficiency and maintain crystallinity is desired.

The present invention is directed to overcoming or at least reducing the effects of one or more of the problems set forth above.

SUMMARY OF THE INVENTION

A method for manufacturing a perpendicular magnetic recording medium of this invention is characterized in including at least a process of forming an intermediate layer of MgO on a nonmagnetic base by a reactive DC sputtering method that uses a target containing Mg and MgO in an oxygen-containing gas, and a process of forming a magnetic recording layer containing an $L1_0$ ordered alloy on the intermediate layer. Here, it is desirable that the target contain from 25 to 90 mass Mg relative to the total mass of the target. Further, it is desirable that the oxygen-containing gas have an oxygen partial pressure of 0.5 Pa or higher and a total pressure of 10 Pa or lower.

In the above configuration, by imparting conductivity to the target by including Mg, a DC sputtering method can be used to form the MgO layer with a high film deposition rate. Thus, mass production of perpendicular magnetic recording media becomes possible, and manufacturing costs are reduced. Further, by adopting a reactive DC sputtering method in an oxygen-containing gas, the Mg in the target and oxygen can react to deposit MgO, and moreover oxygen deficiency in the crystal structure can be suppressed, enabling formation of an MgO intermediate layer with high crystallinity. As a result, perpendicular magnetic recording media having high thermal stability and excellent magnetic characteristics can be manufactured.

BRIEF DESCRIPTION OF THE DRAWINGS

The foregoing advantages and features of the invention will become apparent upon reference to the following detailed description and the accompanying drawing. The sole FIGURE of drawing is a schematic cross-sectional view showing an example of a perpendicular magnetic recording medium manufactured by a method of this invention.

DETAILED DESCRIPTION OF SPECIFIC EMBODIMENTS

A method for manufacturing a perpendicular magnetic recording medium of this invention is characterized in including at least a process of forming an intermediate layer of MgO on a nonmagnetic base by a reactive DC sputtering method that uses a target containing Mg and MgO in an oxygen-containing gas, and a process of forming a magnetic recording layer containing an $L1_0$ ordered alloy on the intermediate layer. The perpendicular magnetic recording medium manufactured by a method of this invention contains at least a nonmagnetic base, an intermediate layer, and a magnetic recording layer, and a soft magnetic under layer and/or under layer may optionally be provided between the nonmagnetic base and the intermediate layer; and a protective layer and/or a lubricating layer may be provided on the magnetic recording layer. FIG. 1 shows an example of a perpendicular magnetic recording medium manufactured by a method of this invention, in which a soft magnetic under layer 2, under layer 3, intermediate layer 4, magnetic recording layer 5, protective layer 6, and lubricating layer 7 are formed in order on non-magnetic base 1.

Nonmagnetic base 1 is formed from various nonmagnetic materials having a smooth surface. For example, an aluminum alloy base with NiP plating, a reinforced glass base, a crystallized glass base, or other bases generally used in the field of magnetic recording media can be used as nonmagnetic base 1.

Soft magnetic under layer 2 which optionally may be provided can be formed using a FeTaC alloy, Sendust (FeSiAl) alloy or another crystalline alloy, or using CoZrNb, CoTaZr or another amorphous Co alloy. Optimal values vary depending on the structure and characteristics of the magnetic head used in recording, but from the standpoint of improving productivity, it is desirable that soft magnetic under layer 2 have a film thickness of 10 nm or greater and 100 nm or less.

The purpose of under layer 3 which optionally may be provided is to secure adhesion strength between soft magnetic under layer 2 and intermediate layer 4, and to effect (001) orientation of intermediate layer 4. Under layer 3 can be formed using NiW, Ta, Cr, or an alloy containing Ta and/or Cr. Further, under layer 3 may have a layered structure comprising a plurality of layers including the aforementioned materials. In consideration of improvement of the crystallinity of intermediate layer 4 and magnetic recording layer, improvement of productivity, and optimization for the magnetic field generated by the head during recording, it is desirable that under layer 3 have a film thickness of 1 nm or greater and 20 nm or less.

The purposes of intermediate layer 4 are to effect (001) orientation of crystals of the $L1_0$ ordered alloy in magnetic recording layer 5, and to suppress an initial layer formed at the outset in formation of magnetic recording layer 5. Intermediate layer 4 is formed from MgO.

In forming intermediate layer 4, a reactive DC sputtering method (preferably a reactive DC magnetron sputtering method), employing a target containing Mg and MgO in an oxygen-containing gas, is used. Through the inclusion of Mg, electrical conductivity is imparted to the target, and by this means a DC sputtering method can be used without problems. The content of Mg in the target is from 25 to 90 mass % relative to the total mass of the target, and preferably is from 50 to 70 mass %. The target can be formed by mixing Mg powder and MgO powder in a prescribed ratio, and then compression-molding this mixture. The Mg powder can for example be prepared by an inert gas atomizer method, or by electrolysis of MgCl or similar. The MgO powder can be prepared by a mechanical crushing method using, for example, a ball mill, a stamp mill or similar. Compression-molding of the powder mixture of Mg and MgO can be performed by any molding technique known in this field, such as a hot isostatic pressing method, a pulse-electric current sintering method, or a similar method.

When forming intermediate layer 4, it is desirable that the surface temperature of the substrate for film deposition is heated to 200° C. or higher and 400° C. or lower. Here, the substrate is any one of nonmagnetic base 1, or nonmagnetic base 1 on which soft magnetic under layer 2 and/or under layer 3 is layered. Heating of the substrate for film deposition can be performed using any means known in the field, such as a lamp heater or similar.

Further, when forming intermediate layer 4, film deposition power of 100 W or greater and 600 W or less, and preferably 200 W or greater and 400 W or less, is supplied. By supplying film deposition power in such a range, a film deposition rate appropriate for mass production of perpendicular magnetic recording media can be attained, while preventing an excessive rise in the surface temperature of the substrate for film deposition.

The oxygen-containing gas used when forming intermediate layer 4 may be pure oxygen gas, or may be a gas mixture of oxygen and an inert gas. Inert gas can be argon gas or another rare gas, nitrogen, or similar. It is desirable that the oxygen-containing gas have an oxygen partial pressure (when using pure oxygen gas, it is the same as the total pressure) of 0.5 Pa or higher and 25 Pa or lower, and more preferably 0.75 Pa or higher and 10 Pa or lower. By containing oxygen with a partial pressure in such a range, reaction is possible with Mg sputtered from the target to deposit MgO, and at the same time oxygen deficiency in the deposited MgO film can be prevented, and the crystallinity of the MgO film can be improved. When using a gas mixture of oxygen and an inert gas as the oxygen-containing gas, it is desirable that the total pressure of the oxygen-containing gas is 25 Pa or lower, and preferably 10 Pa or lower. By setting the total pressure in such a range, a film deposition rate suited to mass production of perpendicular magnetic recording media can be attained while maintaining the crystallinity of the MgO film.

Magnetic recording layer 5 includes an $L1_0$ ordered alloy. It is preferable that magnetic recording layer 5 have a granular structure comprising magnetic crystal grains of an $L1_0$ ordered alloy, and a nonmagnetic matrix to magnetically separate each of the magnetic crystal grains. $L1_0$ ordered alloys which can be used in this invention are alloys in which at least one magnetic metal element selected from a group comprising Fe, Co and Ni, and at least one precious metal element selected from a group comprising Pt, Pd, Au and Ir forms an ordered phase, and may further comprise as an additive Cu, Ag, or a similar element. Preferred $L1_0$ ordered alloys include alloys comprising CoPt, FePt, with Ni or Cu added thereto. The $L1_0$ ordered alloy in magnetic recording layer 5 has a (001) orientation. Nonmagnetic matrices which can be used in this invention include $SiO_2$, $TiO_2$, MgO, C, and similar.

Magnetic recording layer 5 may be a single layer, or may have a layered structure of a plurality of layers. A layered-structure magnetic recording layer 5 is formed with an exchange-coupled composite (ECC) structure comprising a plurality of magnetic layers and nonmagnetic coupling layers disposed between adjacent magnetic layers. Each of the plurality of magnetic layers comprises an $L1_0$ ordered alloy. Or, each of the plurality of magnetic layers may have a granular structure comprising magnetic crystal grains comprising an $L1_0$ ordered alloy, and a nonmagnetic matrix to magnetically separate each of the magnetic crystal grains. The nonmagnetic coupling layers can be formed using a nonmagnetic metal selected from a group comprising V, Cr, Cu, Nb, Mo, Ru, Rh, Ta, W, Re and Ir, a magnetic metal selected from a group comprising Fe, Co and Ni, or an alloy of these.

From the standpoints of improving the magnetic signal recording and reproduction characteristics, suppressing increases in cost due to use of expensive precious metals, and improving productivity, it is desirable that the magnetic recording layer 5 have a film thickness (total film thickness in the case of a layered structure) of 5 nm or greater and 50 nm or less.

Magnetic recording layer 5 can be formed by a sputtering method (in particular a DC magnetron sputtering method) using an $L1_0$ ordered alloy target. The target used can be formed by any technique known in the field, such as fusion alloying, sintering, or similar. It is preferable that formation of magnetic recording layer 5 is performed in an inert gas environment.

When forming magnetic recording layer 5 having a granular structure, a sputtering method (in particular a DC magnetron sputtering method) using a target formed by mixing the $L1_0$ ordered alloy and the nonmagnetic matrix in a prescribed ratio can be used. Further, magnetic recording layer 5 having an ECC structure can be produced by forming, in alternation, a magnetic layer by a sputtering method and a nonmagnetic coupling layer by a sputtering method.

Protective layer 6 which optionally may be provided is a layer used to prevent damage to magnetic recording layer 5, and can be formed using various materials known in the field. For example, protective layer 6 can be formed using a material the principal component of which is carbon.

Lubricating layer 7 which optionally may be provided is a layer used to cause smooth sliding of the magnetic head when the magnetic head is in contact with the perpendicular magnetic recording medium, and can be formed using various materials known in the field. For example, lubricating layer 7 can be formed using a perfluoro polyether system lubricant.

Soft magnetic under layer 2, under layer 3, protective layer 6 and lubricating layer 7 can be formed using various film deposition techniques normally used in the field of magnetic recording media. For example, a sputtering method (in particular a DC magnetron sputtering method), vacuum evaporation deposition method, CVD method, or similar can be used in forming soft magnetic under layer 2, under layer 3 and protective layer 6. To form lubricating layer 7, a dipping method, spin-coating method, or other application technique can be used.

The perpendicular magnetic recording medium of this invention will be explained in greater detail using the examples described below. However, the invention is not limited to these examples, and various modifications can of course be made without deviating from the gist of the invention.

EXAMPLE 1

This example relates to manufacture of a perpendicular magnetic recording medium having, in order on a nonmagnetic base, a CoZrNb soft magnetic under layer, Ta/Cr under layer, MgO intermediate layer, FePt—C granular magnetic recording layer, C protective film, and lubricating layer.

A chemically reinforced glass base with a smooth surface (for example an N-10 glass base manufactured by Hoya Corp.) was prepared as the nonmagnetic base, and after cleaning was introduced into a sputtering apparatus. Next, a Co8Zr5Nb target was used in DC magnetron sputtering to form a CoZrNb amorphous soft magnetic under layer of film thickness 100 nm. At this time, a Co8Zr5Nb target was used, and the sputtering gas was Ar gas at a pressure of 0.67 Pa.

On the soft magnetic under layer, a Ta film of film thickness 5 nm was formed by a DC magnetron sputtering method using a Ta target, and then a Cr target was used in a DC magnetron sputtering method to form a Cr film of film thickness 20 nm, to obtain a Ta/Cr under layer with a two-layer structure. At this time, the sputtering gas was Ar gas at a pressure of 0.67 Pa.

Next, the layered member thus obtained was heated using a lamp heater so that the base surface temperature was 280° C., and a reactive DC sputtering method was used to form an MgO intermediate layer of film thickness 20 nm. At this time, a 50 mass % MgO-50 mass % Mg target was used, and as the sputtering gas, oxygen gas at pressure 1.0 Pa was used. By supplying 300 W of DC power to perform film deposition, an MgO intermediate layer of film thickness 20 nm was obtained in 3.0 seconds.

Next, a lamp heater was used in heating so that the surface temperature of the layered member was 400° C. Immediately after the end of heating, a DC magnetron sputtering method was used to form a FePt—C magnetic recording layer of film thickness 20 nm. At this time, an 80(Fe50Pt)-20C target, with 20 atomic % C intermixed in a Fe50Pt alloy was used, and as the sputtering gas, Ar gas at a pressure of 0.67 Pa was used. Here, the notation of a Fe50Pt alloy represents an alloy containing 50 atomic % Pt relative to all atoms and the remainder Fe.

Next, a DC magnetron sputtering method was used to form a protective layer of film thickness 5 nm. At this time, a carbon target was used, and as the sputtering gas, Ar gas at a pressure of 0.67 Pa was used. After the end of protective layer formation, the layered member was removed from the sputtering apparatus.

Finally, a perfluoro polyether lubricant was applied by a dipping method to form a lubricating layer of film thickness 2 nm, to obtain a perpendicular magnetic recording medium.

COMPARATIVE EXAMPLE 1

A procedure similar to that of Example 1 was used to form a CoZrNb amorphous soft magnetic under layer and a Ta/Cr under layer on a nonmagnetic base.

Next, an RF sputtering method was used to form an MgO intermediate layer of film thickness 20 nm. At this time, an MgO target was used, and as the sputtering gas, oxygen gas at a pressure of 1.0 Pa was used. Film deposition was performed with an RF power of 300 W supplied, and 120 seconds were required to obtain the MgO intermediate layer of film thickness 20 nm.

Thereafter, a procedure similar to that of Example 1 was used to form the FePt—C magnetic recording layer, protective layer, and lubricating layer, to obtain a perpendicular magnetic recording medium.

Evaluation

In Example 1 and Comparative Example 1, samples of the layered members up to formation of the MgO intermediate layers were extracted, and analyses were performed using an X-ray diffraction apparatus. Here, the ratios of Mg to MgO in the MgO intermediate layers were determined from the ratio of intensities of the Mg (100) peak to the MgO (002) peak.

Further, the rocking curve method was used to evaluate the orientation dispersion (Δθ50) of the MgO intermediate layer. Evaluation results are shown in Table 1.

A magnetic torque meter was used to evaluate the uniaxial anisotropy constant (Ku) of the FePt—C magnetic recording layers of perpendicular magnetic recording media obtained in Example 1 and Comparative Example 1. Evaluation results are shown in Table 1.

From measured values obtained, those samples satisfying all the following conditions were judged "superior", and those satisfying one or two of the following conditions were judged to be "good":

(1) A film deposition time to obtain a film of thickness 20 nm of 9 seconds or less (mass producibility);
(2) a Δθ50 value of 6.0 degrees or less (signal characteristics and thermal stability of the perpendicular magnetic recording medium); and
(3) a Ku value of $1.0\times10^6$ J/m$^3$ or higher (signal characteristics and thermal stability of the perpendicular magnetic recording medium).

On the other hand, samples satisfying any one of the following conditions were judged to be "poor":

(4) a film deposition time to obtain a film of thickness 20 nm of 120 seconds or longer;
(5) a Δθ50 value of 10.0 degrees or more; or
(6) a Ku value of $0.6\times10^6$ J/m$^3$ or lower.

In Example 1, the film deposition time required to obtain an MgO intermediate layer of film thickness 20 nm was 3.0 seconds. This film deposition rate is sufficient to enable manufacture of 1000 perpendicular magnetic recording media per hour on a single manufacturing line. In X-ray diffraction analyses, no Mg (100) peak was observed, and it was found that elemental Mg was not included in the MgO intermediate layers in Example 1. Further, the Δθ50 value was 4.5 degrees, and the Ku value was $1.5\times10^6$ J/m$^3$, so that Example 1 samples were judged "superior".

On the other hand, in Comparative Example 1a Mg (100) peak was not observed in X-ray diffraction analyses, and it was found that elemental Mg was not included in the MgO intermediate layers in Comparative Example 1. The Δθ50 value was 2.5 degrees, and the Ku value was $1.7\times10^6$ J/m$^3$, satisfying the above standards (2) and (3). However, in Comparative Example 1, the film deposition time to obtain an MgO intermediate layer of film thickness 20 nm was 120 seconds, corresponding to the standard of (4) above, and so Comparative Example 1 was judged "poor". This film deposition rate means that parallel processing of from 13 to 33 units would be required to obtain a throughput of 400 to 1000 units per hour, which is normally required in the manufacture of magnetic recording media. Hence formation of the MgO intermediate layer by an RF sputtering method is not realistic.

In this way, by using an MgO—Mg target containing Mg within MgO, a medium having high thermal stability and magnetic characteristics can be deposited within a time compatible with mass production.

TABLE 1

Evaluation of Example 1 and Comparative Example 1

| | Example 1 | Comparative Example 1 |
|---|---|---|
| Film deposition time (sec) | 3.0 | 120 |
| Mg(100)/MgO(002) peak intensity ratio | 0 | 0 |
| Δθ50 (deg) | 4.5 | 2.5 |
| Ku ($\times10^6$ J/m$^3$) | 1.5 | 1.7 |
| Judgment | superior | poor |

EXAMPLE 2

Except for changing the mass ratio of the MgO and Mg in the target used during film deposition of the MgO intermediate layer, the same procedure as in Example 1 was used to manufacture a perpendicular magnetic recording medium. The mass ratio of Mg and MgO of the target used, evaluation results and judgments are shown in Table 2.

TABLE 2

Effect of target composition (sputtering gas: 1.0 Pa oxygen)

| | Sample ID | | | | | | |
|---|---|---|---|---|---|---|---|
| | 1 | 2 | 3 | 4 | 5 | 6 | 7 |
| Target | | | | | | | |
| MgO (mass %) | 100 | 90 | 75 | 50 | 25 | 10 | 0 |
| Mg (mass %) | 0 | 10 | 25 | 50 | 75 | 90 | 100 |
| Film deposition time (sec) | deposition failed | 12 | 8.0 | 3.0 | 2.8 | 2.7 | 2.2 |
| Mg(100)/MgO(002) peak intensity ratio | — | 0 | 0 | 0 | 0 | 0 | 0.50 |
| Δθ50 (deg) | — | 3.0 | 4.0 | 4.5 | 5.0 | 4.5 | 10.0 |
| Ku ($\times10^6$ J/m$^3$) | — | 1.6 | 1.6 | 1.5 | 1.3 | 1.5 | 0.5 |
| Judgment | poor | good | superior | superior | superior | superior | poor |

In the case where an MgO target not containing Mg was used in conventional RF sputtering methods (sample ID 1), even when film deposition was continued for 120 seconds, formation of an MgO intermediate layer could not be confirmed. Hence the condition (4) above applied, and the sample with ID 1 was judged "poor".

When using a 90 mass % MgO-10 mass % Mg target (sample ID 2), no Mg (100) peak was observed in the X-ray diffraction results, and it was found that elemental Mg was not contained in the MgO intermediate layer. Further, the Δθ50 value was 3.0 degrees, the Ku value was $1.6\times10^6$ J/m$^3$, satisfying the above standards (2) and (3). However, the film deposition time to obtain an MgO intermediate layer of film thickness 20 nm was 12 seconds, so that the above standard (1) did not apply, and the sample with ID 2 was judged "good".

Further, in comparisons of samples with IDs 2 to 7, it was found that as the Mg content of the target increased, the film deposition time grew shorter. It was found that by making the Mg content 25 mass % or greater, the above standard (1), a film deposition time of 9 seconds or shorter, could be satisfied.

However, it was found that when using a 100 mass % Mg target not containing MgO (sample ID 7), X-ray diffraction analyses indicated that elemental Mg exists in the MgO intermediate layer. Further, the above (5) and (6) were applicable to the orientation dispersion ($\Delta\theta50$) and uniaxial anisotropy constant (Ku), and so the sample with ID 7 was judged "poor". The increased orientation dispersion is thought to occur because Mg in the target was not completely converted into MgO by oxygen used as the sputtering gas, so that disordering of the crystal structure in the MgO layer formed and oxygen deficiency in the MgO crystal lattice occurred. Further, the decline in the uniaxial anisotropy constant (Ku) is thought to occur because the magnetic recording layer was formed on an intermediate layer having defects as described above, so that disordering in the orientation of magnetic crystal grains in the magnetic recording layer occurred.

In this way, samples with IDs 3 to 6, for which targets were used containing Mg in amounts from 25 to 90 mass %, satisfied all of the above (1) to (3), and so were judged "superior".

EXAMPLE 3

Except for changing the composition of the target used during film deposition of the MgO intermediate layer to 75 mass % MgO-25 mass % Mg, and varying the pressure of the oxygen used as the sputtering gas, the same procedure as in Example 1 was used to manufacture a perpendicular magnetic recording medium. The oxygen pressure, evaluation results and judgments are shown in Table 3.

TABLE 3

Effect of sputtering gas pressure
Target: 75 mass % MgO—25 mass % Mg

| | Sample ID | | | |
|---|---|---|---|---|
| | 3 | 8 | 9 | 10 |
| Oxygen pressure (Pa) | 1.0 | 0.75 | 0.50 | 0.25 |
| Film deposition time (sec) | 8.0 | 7.0 | 6.5 | 5.6 |
| Mg(100)/MgO(002) peak intensity ratio | 0 | 0 | 0 | 0.10 |
| $\Delta\theta50$ (deg) | 4.0 | 4.5 | 5.0 | 7.0 |
| Ku ($\times10^6$ J/m$^3$) | 1.6 | 1.5 | 1.4 | 0.9 |
| Judgment | superior | superior | superior | good |

As indicated for samples with IDs 3, 8 and 9, even when the pressure of the oxygen gas used as the sputtering gas is lowered, if the oxygen pressure is 0.50 Pa or higher, the above standards (1) to (3) are satisfied, and samples judged "superior" can be obtained.

On the other hand, as indicated by the sample with ID 10, it was found that if the oxygen pressure is lowered to 0.25 Pa, X-ray diffraction results indicate that elemental Mg exists in the MgO intermediate layer. Due to the existence of Mg, the orientation dispersion ($\Delta\theta50$) and uniaxial anisotropy constant (Ku) do not satisfy the above standards (2) and (3), and so the sample with ID 10 was judged "good".

EXAMPLE 4

Except for varying the pressure of the oxygen used as the sputtering gas, the same procedure as in Example 1 was used to manufacture a perpendicular magnetic recording medium. The composition of the target used in this example was the same 50 mass % MgO-50 mass % Mg as in Example 1. The oxygen pressure, evaluation results, and judgments are shown in Table 4.

TABLE 4

Effect of sputtering gas pressure
Target: 50 mass % MgO—50 mass % Mg

| | Sample ID | | | | | | | | |
|---|---|---|---|---|---|---|---|---|---|
| | 18 | 17 | 16 | 15 | 14 | 4 | 11 | 12 | 13 |
| Oxygen pressure (Pa) | 30 | 25 | 15 | 10 | 3.0 | 1.0 | 0.75 | 0.50 | 0.25 |
| Film deposition time (sec) | 138 | 92 | 39 | 8.0 | 4.2 | 3.0 | 2.8 | 2.7 | 2.6 |
| Mg(100)/MgO(002) peak intensity ratio | 0 | 0 | 0 | 0 | 0 | 0 | 0 | 0 | 0.15 |
| $\Delta\theta50$ (deg) | 5.0 | 4.3 | 3.5 | 3.0 | 3.8 | 4.5 | 5.0 | 5.5 | 8.0 |
| Ku ($\times10^6$ J/m$^3$) | 1.3 | 1.5 | 1.7 | 1.7 | 1.6 | 1.5 | 1.4 | 1.2 | 0.9 |
| Judgment | poor | good | good | superior | superior | superior | superior | superior | good |

As indicated for the samples with IDs 4, 11 and 12, even when the pressure of the oxygen gas used as the sputtering gas was lowered, if the oxygen pressure was 0.50 Pa or higher and 1.0 Pa or lower, the above standards (1) to (3) were satisfied, and samples judged "superior" could be obtained. This result was the same when using a target of composition 75 mass % MgO-25 mass % Mg in Example 3.

On the other hand, as indicated for the sample with ID 13, when the oxygen pressure was lowered to 0.25 Pa the X-ray diffraction analyses indicated that elemental Mg existed in the MgO intermediate layer. Through comparison with the sample with ID 10 of Example 3, it is found that in the sample with ID 13 for which the target Mg content was high had an increased amount of elemental Mg in the MgO intermediate layer. Due to the presence of Mg the orientation dispersion (Δθ50) and uniaxial anisotropy constant (Ku) did not satisfy the above standards (2) and (3), and the sample with ID 13 was judged "good".

As indicated for the samples with IDs 14 to 18, when the oxygen pressure was higher than 1.0 Pa, the film deposition time was longer. When the oxygen pressure was 10 Pa or below, as with the samples with IDs 14 and 15, the film deposition time was 9.0 seconds or less, and including the other characteristics, samples judged "superior" could be obtained. When the oxygen pressure was higher than 10 Pa but 25 Pa or lower, as in the cases of the samples with IDs 16 and 17, the film deposition time was longer than 9.0 seconds but equal to or less than 120 seconds, and so samples judged "good" were obtained. On the other hand, when the oxygen pressure was 30 Pa as with the sample with ID 18, the film deposition time was 120 seconds or longer, resulting in a "poor" judgment.

EXAMPLE 5

Except for using as the sputtering gas a gas mixture of oxygen and argon mixed at various ratios, and setting the total pressure of the gas mixture to between 1 and 15 Pa, the same procedure as in Example 1 was used to manufacture a perpendicular magnetic recording medium. The composition of the target used in this example was the same 50 mass % MgO-50 mass % Mg as in Example 1. The gas mixture total pressure, oxygen and argon mixing ratio, oxygen partial pressure, evaluation results, and judgments are shown in Table 5. The oxygen and argon mixing ratio was adjusted by controlling the flow rates of each of the pure gases. The oxygen partial pressure was calculated from the gas mixture total pressure and the mixing ratio of the oxygen gas.

an increase in the probability of scattering due to collisions between sputtered particles and gas particles. The probability of collision of a sputtered particle is approximately dependent on the total pressure of the sputtering gas, and so it is thought that even when an oxygen-containing gas mixture is used, substantially the same results as in the case of pure oxygen gas are obtained.

In comparing the samples with IDs 15 and 20 to 24, for which the gas mixture total pressure was set to 10 Pa, the higher the oxygen partial pressure, the smaller was Δθ50, and the higher was Ku. The samples with IDs of 15 and 20 to 22, for which the oxygen partial pressure was 0.5 Pa or higher, satisfied all the above conditions (1) to (3), and were judged "superior". On the other hand, the sample with ID 23, for which the oxygen partial pressure was less than 0.5 Pa, had a film deposition time of 9.0 seconds or less, but also had a Δθ50 value greater than 6.0 degrees and a Ku smaller than $1 \times 10^6$ J/m$^3$, and so satisfied only condition (1) and did not satisfy conditions (2) and (3), and was judged "good". Further, in the case of the sample with ID 24 for which pure argon gas was used, an MgO intermediate layer could not be formed.

In comparing the samples with IDs 4, 25 and 26 also, for which the gas mixture total pressure was set to 1 Pa, results similar to those for samples with IDs 15 and 20 to 24 were obtained. That is, the samples with IDs 4 and 25, for which the oxygen partial pressure was 0.5 Pa or higher, satisfied all the above conditions (1) to (3), and were judged "superior". On the other hand, the sample with ID 26, for which the oxygen partial pressure was less than 0.5 Pa, had a film deposition time of 9.0 seconds or less, but had a Δθ50 value greater than 6.0 degrees as well as a Ku smaller than $1 \times 10^6$ J/m$^3$, and so satisfied condition (1) only and not conditions (2) and (3), and was judged "good".

TABLE 5

Effect of sputtering gas mixture
Target: 50 mass % MgO—50 mass % Mg)

| | Sample ID | | | | | | | | | |
|---|---|---|---|---|---|---|---|---|---|---|
| | 19 | 15 | 20 | 21 | 22 | 23 | 24 | 4 | 25 | 26 |
| Gas mixture | | | | | | | | | | |
| Total pressure (Pa) | 15 | 10 | 10 | 10 | 10 | 10 | 10 | 1 | 1 | 1 |
| Oxygen fraction | 50 | 100 | 50 | 10 | 5 | 2.5 | 0 | 100 | 50 | 25 |
| Argon fraction | 50 | 0 | 50 | 90 | 95 | 97.5 | 100 | 0 | 50 | 75 |
| Oxygen partial pressure (Pa) | 7.5 | 10 | 5.0 | 1.0 | 0.5 | 0.25 | 0 | 1.0 | 0.5 | 0.25 |
| Film deposition time (sec) | 45 | 8.0 | 8.2 | 8.6 | 8.8 | 8.8 | dep. failed | 3.0 | 3.2 | 3.6 |
| Mg(100)/MgO(002) peak intensity ratio | 0 | 0 | 0 | 0 | 0 | 0.15 | — | 0 | 0 | 0.15 |
| Δθ50 (deg) | 3.3 | 3.0 | 3.5 | 5.0 | 5.5 | 8.5 | — | 4.5 | 5.5 | 8.5 |
| Ku (×10$^6$ J/m$^3$) | 1.7 | 1.7 | 1.6 | 1.4 | 1.2 | 0.8 | — | 1.5 | 1.3 | 0.8 |
| Judgment | good | superior | superior | superior | superior | good | poor | superior | superior | good |

In comparing the samples with IDs 19, 20 and 25, for which a gas mixture with an oxygen/argon mixing ratio of 50/50 was used, as the total pressure of the gas mixture rose the film deposition time lengthened. The samples with IDs 20 and 25, for which the gas mixture total pressure was 10 Pa or lower, had film deposition times of 9.0 seconds or less, and including other characteristics were judged "superior". On the other hand, the same with ID 19, with a gas mixture total pressure greater than 10 Pa, had a film deposition time longer than 9.0 seconds, and was judged "good". These results were similar to those for Example 4 using pure oxygen gas as the sputtering gas. This phenomenon is thought to occur because a rise in pressure within the sputtering apparatus is accompanied by To summarize the results for Example 4 using pure oxygen gas as the sputtering gas and for Example 5 using a gas mixture containing oxygen, it was found that when the sputtering gas total pressure was 10 Pa or lower, the film deposition time to obtain a film thickness of 20 nm was 9.0 seconds or less, indicating high suitability for mass production. Further when the oxygen partial pressure was 0.5 Pa or higher, a Δθ50 value of 6.0 degrees or less and a Ku value of $1 \times 10^6$ J/m$^3$ or greater were obtained, and a perpendicular magnetic recording medium with satisfactory signal characteristics and thermal stability could be obtained.

Thus, a method for manufacturing a perpendicular magnetic recording medium has been described according to the present invention. Many modifications and variations may be made to the techniques and structures described and illustrated herein without departing from the spirit and scope of the invention. Accordingly, it should be understood that the methods described herein are illustrative only and are not limiting upon the scope of the invention.

This application is based on and claims priority to Japanese Patent Application 2010-238550, filed on Oct. 25, 2010. The disclosure of the priority application in its entirety, including the drawings, claims, and the specification thereof, is incorporated herein by reference.

What is claimed is:

1. A method for manufacturing a perpendicular magnetic recording medium, comprising at least:
    forming an intermediate layer of MgO on a nonmagnetic base by a reactive DC sputtering method that uses a target containing Mg and MgO in an oxygen-containing gas; and
    forming a magnetic recording layer containing an $L1_0$ ordered alloy on the intermediate layer
    wherein the target contains from 10 to 90 mass % Mg relative to the total mass of the target.

2. The method for manufacturing a perpendicular magnetic recording medium according to claim 1, wherein the target contains from 25 to 90 mass % Mg relative to the total mass of the target.

3. The method for manufacturing a perpendicular magnetic recording medium according to claim 1, wherein the oxygen-containing gas has an oxygen partial pressure of 0.5 Pa or higher and a total pressure of 10 Pa or lower.

4. The method for manufacturing a perpendicular magnetic recording medium according to claim 2, wherein the oxygen-containing gas has an oxygen partial pressure of 0.5 Pa or higher and a total pressure of 10 Pa or lower.

5. The method for manufacturing a perpendicular magnetic recording medium according to claim 1, wherein the oxygen-containing gas has an oxygen partial pressure of 0.5 Pa or higher and 25 Pa or lower.

6. The method for manufacturing a perpendicular magnetic recording medium according to claim 1, wherein the oxygen-containing gas used when forming intermediate layer is pure oxygen gas.

7. The method for manufacturing a perpendicular magnetic recording medium according to claim 1, wherein the oxygen-containing gas used when forming intermediate layer is a gas mixture of oxygen and an inert gas.

8. The method for manufacturing a perpendicular magnetic recording medium according to claim 7, wherein the inert gas is a rare gas.

9. The method for manufacturing a perpendicular magnetic recording medium according to claim 7, wherein the inert gas is nitrogen.

10. The method for manufacturing a perpendicular magnetic recording medium according to claim 7, wherein the inert gas is argon.

11. The method for manufacturing a perpendicular magnetic recording medium according to claim 1, wherein the surface temperature of the substrate for film deposition is 200° C. or higher and 400° C. or lower.

12. The method for manufacturing a perpendicular magnetic recording medium according to claim 1, wherein film deposition power is 100 W or greater and 600 W or less.

13. The method for manufacturing a perpendicular magnetic recording medium according to claim 1, wherein film deposition power is 200 W or greater and 400 W or less.

14. The method for manufacturing a perpendicular magnetic recording medium according to claim 1, wherein
    the oxygen-containing gas has an oxygen partial pressure of 0.5 Pa or higher and a total pressure of 10 Pa or lower,
    surface temperature of the substrate for film deposition is 200° C. or higher and 400° C. or lower, and
    film deposition power is 200 W or greater and 400 W or less.

* * * * *